(12) United States Patent
Crosland et al.

(10) Patent No.: US 9,053,777 B1
(45) Date of Patent: Jun. 9, 2015

(54) METHODS AND APPARATUS FOR MEMORY INTERFACE SYSTEMS

(71) Applicant: Altera Corporation, San Jose, CA (US)

(72) Inventors: Andrew Crosland, Haddenham (GB); Clive Davies, Cumnor (GB)

(73) Assignee: Altera Corporation, San Jose, CA (US)

( * ) Notice: Subject to any disclaimer, the term of this patent is extended or adjusted under 35 U.S.C. 154(b) by 260 days.

(21) Appl. No.: 13/661,849

(22) Filed: Oct. 26, 2012

(51) Int. Cl.
*G11C 8/00* (2006.01)
*G11C 7/22* (2006.01)
*G11C 7/10* (2006.01)

(52) U.S. Cl.
CPC ............... *G11C 7/22* (2013.01); *G11C 7/1072* (2013.01); *G11C 7/222* (2013.01)

(58) Field of Classification Search
USPC .................... 365/233.1, 233.11, 233.16, 222
See application file for complete search history.

(56) References Cited

U.S. PATENT DOCUMENTS

| 5,519,883 A * | 5/1996 | White et al. ................. 710/315 |
| 5,790,842 A * | 8/1998 | Charles et al. ............... 713/600 |
| 6,999,369 B2 * | 2/2006 | Perner .......................... 365/222 |

* cited by examiner

*Primary Examiner* — Son Dinh
(74) *Attorney, Agent, or Firm* — Ropes & Gray LLP (57) ABSTRACT

Methods and systems for memory interface systems are provided. A first command from control circuitry is received by bridge circuitry at a first clock rate. The control circuitry is configured to operate at the first clock rate. A second command is generated by the control circuitry on the received first command. The second command is transmitted to memory circuitry at a second clock rate. The memory circuitry is configured to operate at the second clock rate, and the second clock rate is greater than the first clock rate.

18 Claims, 3 Drawing Sheets

METHODS AND APPARATUS FOR MEMORY INTERFACE SYSTEMS

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly not impliedly admitted as prior art against the present disclosure.

The present disclosure relates to memory systems and methods, and more specifically memory interface systems.

During development of a particular circuit design, a Field Programmable Gate Array (FPGA) may be used to emulate the behavior of the circuit design as it would be implemented on an Application-Specific Integrated Circuit (ASIC). By emulating the behavior of the circuit design, the FPGA may be used to facilitate testing of circuit design prototypes. However, an FPGA typically operates at a clock rate that is substantially less than the clock rate of the ASIC. The slower clock rate of the FPGA may present problems when the emulated circuit interfaces with memory circuitry, and the emulation requires full cycle accuracy (i.e., an exact correspondence at each clock cycle between the states of the components of the circuit design as emulated on an FPGA and the states of the components of the circuit design as they would be implemented on an ASIC). In particular, because the clock rate of the FPGA may fall below the minimum operating frequency of the memory circuitry, a modification of the circuit design or a modification of the memory circuitry may be required for the emulated circuit design to properly interface with the memory circuitry.

SUMMARY OF THE DISCLOSURE

Described herein are systems, devices, and methods for use in memory interfaces. In an arrangement, a system comprises bridge circuitry configured to receive a first command from control circuitry at a first clock rate, where the control circuitry is configured to operate at the first clock rate, generate a second command based on the received first command, and transmit the second command to memory circuitry at a second clock rate, where the memory circuitry is configured to operate at the second clock rate and the second clock rate is greater than the first clock rate.

In certain implementations, the memory circuitry comprises dynamic random access (DRAM) memory circuitry, data stored in the DRAM memory circuitry is lost in response to the DRAM memory circuitry receiving the refresh commands at a rate less than a threshold rate, and the control circuitry, in response to being configured to operate at the first clock rate, is configured to transmit the refresh commands to the DRAM memory circuitry at a maximum rate that is less than the threshold rate.

In certain implementations, the memory circuitry comprises DRAM circuitry, and the bridge circuitry further comprises refresh timer circuitry configured to periodically refresh data stored in the DRAM memory circuitry. In certain implementations, the bridge circuitry is further configured to receive a data read command from the control circuitry, where the data read command is associated with a first interface scheme, transmit to the memory circuitry a plurality of commands based on the received data read command, where the transmitted plurality of commands is associated with the first interface scheme, and receive, from the memory circuitry, based on the transmitted plurality of commands, stored data associated with the data read command.

In certain implementations, the bridge circuitry is further configured to receive, from the control circuitry, a data write command and data associated with the data write command, where the data write command is associated with a first interface scheme, and transmit to the memory circuitry a plurality of commands based on the received data write command, where the plurality of commands are associated with the first interface scheme, and the plurality of commands configure the memory circuitry to store the data associated with the received data write command.

In certain implementations, the bridge circuitry is further configured to receive, with the bridge circuitry, a burst data read command from the control circuitry, where the burst data read command is associated with a plurality of data addresses of data stored in the memory circuitry, transmit to the memory circuitry a plurality of commands based on the received burst data read command, and receive, from memory circuitry, based on the transmitted plurality of commands, data stored in the memory circuitry at each data address of the plurality of data addresses. In certain implementations, the control circuitry is configured to operate in a first clock domain associated with the first clock rate, the memory circuitry is configured to operate in a second clock domain associated with the second clock rate, and the first clock domain is independent from the second clock domain. In certain implementations, the control circuitry comprises FPGA circuitry, and the memory circuitry comprises DRAM circuitry. In certain implementations, the bridge circuitry is further configured to appear to the control circuitry as a further memory circuitry configured to operate at the first clock rate.

Also described herein are systems, devices, and methods for use in memory interfaces. A first command is received with bridge circuitry from control circuitry at a first clock rate, where the control circuitry is configured to operate at the first clock rate. A second command is generated based on the received first command, and the second command is transmitted to memory circuitry at a second clock rate, where the memory circuitry is configured to operate at the second clock rate, and the second clock rate is greater than the first clock rate.

In certain implementations, the memory circuitry comprises DRAM circuitry, data stored in the DRAM memory circuitry is lost in response to the DRAM memory circuitry receiving the refresh commands at a rate less than a threshold rate, and the control circuitry, in response to being configured to operate at the first clock rate, is configured to transmit the refresh commands to the DRAM memory circuitry at a maximum rate that is less than the threshold rate. In certain implementations, the memory circuitry comprises DRAM circuitry, and the bridge circuitry further comprises refresh timer circuitry configured to periodically refresh data stored in the DRAM memory circuitry.

In certain implementations, a data read command is received with the bridge circuitry, where the data read command is associated with a first interface scheme. A plurality of commands based on the received data read command are transmitted to the memory circuitry, where the transmitted plurality of commands is associated with the first interface scheme, and stored data associated with the data read command is received, from the memory circuitry, based on the transmitted plurality of commands.

In certain implementations, a data write command and data associated with the data write command is received, with the bridge circuitry, from the control circuitry, where the write command is associated with a first interface scheme, and a plurality of commands is transmitted to the memory circuitry based on the received data write command, where the plurality of commands are associated with the first interface scheme, and the plurality of commands configure the memory circuitry to store the data associated with the received data write command.

In certain implementations, a burst data read command is received with the bridge circuitry from the control circuitry, where the burst data read command is associated with a plurality of data addresses of data stored in the memory circuitry, a plurality of commands based on the received burst data read command is transmitted to the memory circuitry, and data stored in the memory circuitry at each data address of the plurality of data addresses is received from memory circuitry, based on the transmitted plurality of commands. In certain implementations, the control circuitry comprises FPGA circuitry, and the memory circuitry comprises DRAM circuitry.

In certain implementations, the control circuitry is configured to operate in a first clock domain associated with the first clock rate, the memory circuitry is configured to operate in a second clock domain associated with the second clock rate, and the first clock domain is independent from the second clock domain. In certain implementations, the bridge circuitry is further configured to appear to the control circuitry as a further memory circuitry configured to operate at the first clock rate.

Also described herein are systems, devices, and methods for use in bridge circuitry. The bridge circuitry comprises address logic circuitry configured to process a first data address received from control circuitry at a first clock rate, where the control circuitry is configured to operate at the first clock rate, state machine circuitry configured to generate a first plurality of commands based on a read command received from the control circuitry at the first clock rate, and read data circuitry configured to receive, from memory circuitry, first data stored in the memory circuitry based on transmitting the processed first data address and the generated first plurality of commands to the memory circuitry at a second clock rate, where the memory circuitry is configured to operate a at the second clock rate, and the second clock rate is greater than the first clock rate, and store the received first data in read buffer circuitry accessible to the control circuitry.

In certain implementations, the bridge circuitry further comprises write data circuitry configured to receive, at the first clock rate, second data from the control circuitry, where the address logic circuitry is further configured to process a second data address received from the control circuitry, the second data is associated with a second data address, the state machine circuitry is further configured to generate a second plurality of commands based on a write command received from the control circuitry at the first clock rate, and the memory circuitry is further configured to store the second data at the processed second data address based on receiving the second plurality of commands from the bridge circuitry at the second clock rate.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

To provide an overall understanding of the disclosure, certain illustrative embodiments will now be described. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope hereof.

Figure 1:
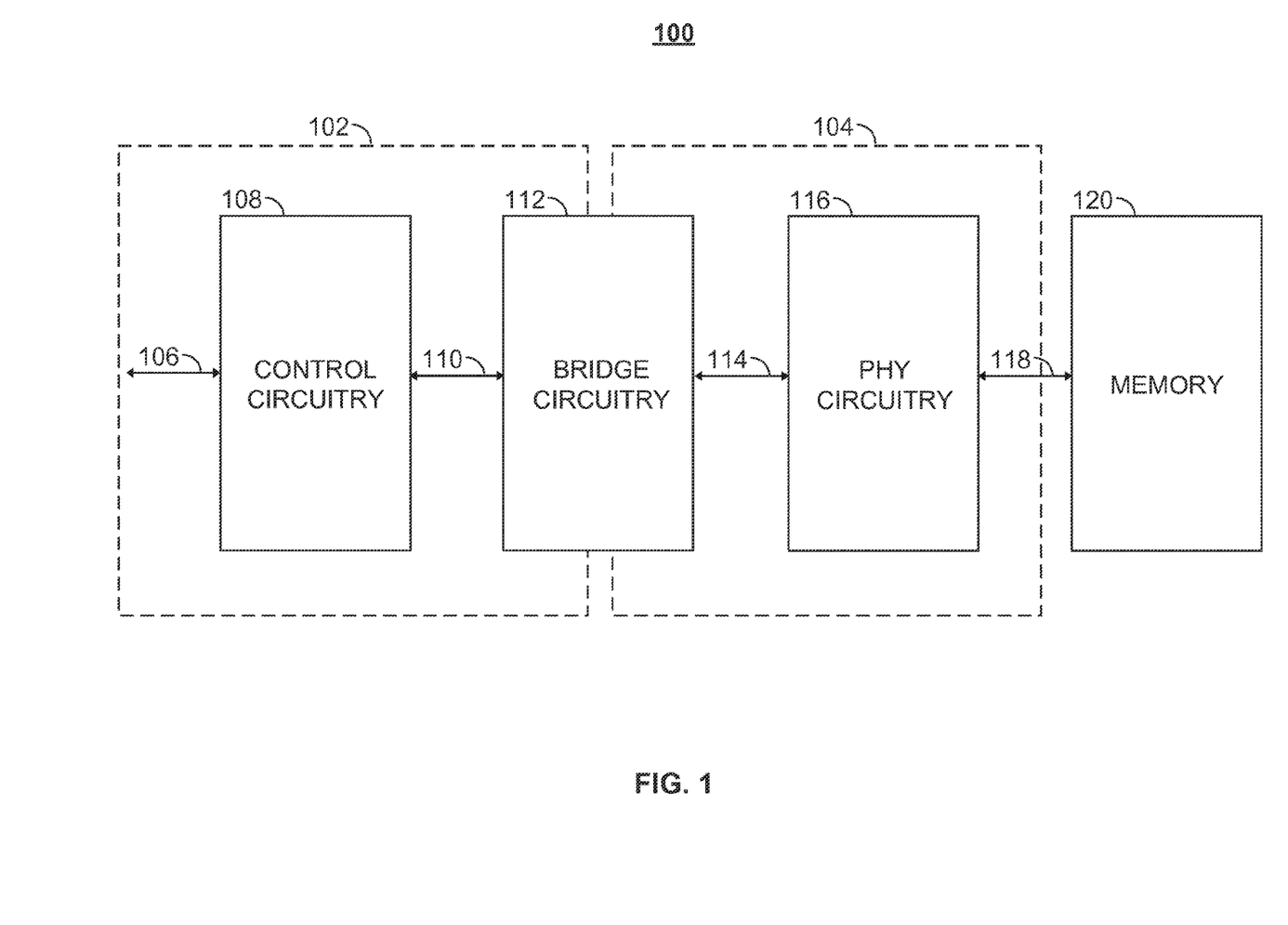
FIG. 1 shows an exemplary memory interface system according to an embodiment of the present disclosure.

FIG. 1 shows an exemplary memory interface system 100 according to an embodiment of the present disclosure. In some embodiments, system 100 may be a part of a larger data processing system.

System 100 includes processing circuitry 102. In some embodiments, processing circuitry is a programmable logic device such as an FPGA. In some embodiments, processing circuitry 102 is a general purpose processor. In some embodiments, processing circuitry 102 is an ASIC. In some embodiments, processing circuitry 102 is part of a larger system.

Processing circuitry 102 includes control circuitry 108, which may communicate with other elements of processing circuitry 102 using data link 106.

System 100 further includes memory interface circuitry 104 coupled to memory circuitry 120.

In some embodiments, the memory circuitry 120 is a non-volatile memory such as e.g., read only memory (ROM) or Flash memory. In some embodiments, the memory circuitry 120 is a volatile memory such as e.g., static random access memory (SRAM) or DRAM. In some embodiments, the memory circuitry 120 is a synchronous dynamic random access memory (SDRAM). In some embodiments, the memory circuitry 120 is a double data rate memory (DDR) such as DDR2 memory. In some embodiments, the memory circuitry 120 is magnetic memory. In some embodiments, the memory circuitry 120 is optical memory. In some embodiments, the memory circuitry 120 is holographic memory. It will be appreciated by those skilled in the art that the memory circuitry 120 may be implemented as any other type of memory without departing from the scope and spirit of the present disclosure.

The memory interface circuitry 104 includes phy circuitry 116. The phy circuitry may communicate with memory circuitry 120 using data link 118.

In some embodiments, the memory interface circuitry 104 and the memory circuitry 120 may be separate circuitries, and/or may be implemented on separate physical devices. In some embodiments, the memory interface circuitry 104 and the memory circuitry 102 may be part of the same circuitry, and/or may be implemented on the same physical device.

In some embodiments, the processing circuitry 102 and the memory interface circuitry 104 may be separate circuitries. In some embodiments, the processing circuitry 102 and the memory interface circuitry 104 may be implemented on separate physical devices. In some embodiments, the processing circuitry 102 and the memory interface circuitry 104 may be part of the same circuitry. In some embodiments, the processing circuitry 102 and the memory interface circuitry 104 may be implemented on the same physical device.

System 100 further includes bridge circuitry 112. The bridge circuitry 112 is coupled to the processing circuitry 102 and the memory interface circuitry 104. In some embodiments, the bridge circuitry 112 is wholly or partially located within the processing circuitry 102. In some embodiments, the bridge circuitry 112 is wholly or partially located within the memory interface circuitry 104. In some embodiments, the bridge circuitry 112 is separate from both the processing circuitry 102 and the memory interface circuitry 104. In some embodiments, the bridge circuitry 112 is coupled to the control circuitry 108 by data link 110 and to the phy circuitry 116 by data link 114.

In some embodiments, one or more of the signals on the data links 106, 110, 114 and/or 118 may be transmitted in combination, for example by using a data bus. In some embodiments, one or more of the signals on the data links 106, 110, 114 and/or 118 may be transmitted in parallel fashion on separate bus lines. In some embodiments, one or more of the signals on the data links 106, 110, 114 and/or 118 may be transmitted in serial fashion on a single bus line.

The processing circuitry 102 may write data to the memory 120 and read data from the memory 120 using the memory interface circuitry 104. In some embodiments, the control circuitry 102 may write data to the memory 120 by providing the memory interface circuitry 104 with data, a data address within the memory interface circuitry 104 to which the data is to be written, and one or more associated control signals such as, e.g., a 'WRITE' command. In some embodiments, the processing circuitry 102 may read data from the memory circuitry 120 by providing a the memory interface circuitry 104 with an address within the memory interface circuitry 104 from which the data is to be read and one or more associated control signals such as, e.g., a 'READ' command.

In some embodiments, the data being read from the memory circuitry 120 and/or being written to the memory circuitry 120 may be encoded using an error correction coding (ECC) scheme. The ECC scheme may be any appropriate scheme for detecting and/or correcting errors introduced into the data due to the transmission of the data on the data links 106, 110, 114 and/or 118, and/or due to processing of the data by circuitries 108, 112, 116, 120, and/or any other circuitries included in or coupled to system 100. Any appropriate circuitries, such as circuitries 108, 112, 116 and/or any other circuitry included in or coupled to system 100, may be used encode and/or decode the data according to the ECC scheme. In some embodiments, when data is being written to the memory circuitry 120, the control circuitry 108, the bridge circuitry 112 and/or the phy circuitry 116 may be used to encode the data using the ECC scheme. In some embodiments, the data provided to system 100 via the data link 106 may already be encoded according to the ECC scheme. In some embodiments, the encoded data may be stored in the memory circuitry 120. In some embodiments, when data is being read from the memory circuitry 120, the circuitries 108, 112 and/or 116 may decode the data according to the ECC scheme. If error(s) are detected, the circuitries 108, 112 and/or 116 may take any appropriate action, such as, e.g., correcting the error(s) using the ECC scheme or requesting re-transmission of the data.

In some embodiments, the memory circuitry 120 is DRAM circuitry, such as Double Data Rate (DDR) RAM circuitry. In these embodiments, the DRAM memory circuitry 120 includes a one or more memory banks. Each memory bank includes one or more addressable memory rows, and one or more addressable memory columns. A particular memory bank, row, and column address identifies a data storage element that can be accessed for reading and writing. Because the DRAM memory circuitry 120 is a dynamic memory, each storage element included in the DRAM memory circuitry 120 needs to be periodically 'refreshed', i.e., the capacitor(s) included in the storage element need to be periodically recharged. If the rate at which a storage element in the memory circuitry 120 is refreshed falls below a certain minimum threshold rate, data stored in the storage element may be lost. The minimum threshold rate is dependent on a particular implementation of the DRAM memory circuitry 120.

In some embodiments, the processing circuitry 102 may write data to the DRAM memory circuitry 120 and read data from the DRAM memory circuitry 120 by using the control circuitry 108 and the phy circuitry 116. In these embodiments, the control circuitry 108 may handle memory access scheduling for reading and writing to the DRAM memory circuitry 120, as well as memory bank management and refresh management for the DRAM memory circuitry 120. The phy circuitry 118 may include a physical interface (e.g., be coupled via device pins) to the storage elements within the DRAM memory circuitry 120. The phy circuitry 116 may handle multiplexing/de-multiplexing of data being read from or written to the storage elements included in the DRAM memory circuitry 120, initialization of the storage elements, and calibration of the physical interface between the phy circuitry 116 and the storage elements. In some embodiments, the control circuitry 108 and the phy circuitry 116 may communicate via the Altera Phy Interface (AFI) protocol.

The control circuitry 116 may access a storage element within the DRAM memory circuitry 120 by transmitting 'ACTIVATE' command to the phy circuitry 116, address bits indicating the memory bank and row of storage element(s) within the DRAM memory circuitry 120 to be accessed. In response to receiving the 'ACTIVATE' command from the control circuitry 108, the phy circuitry 116 may open the indicated memory bank and row within the DRAM memory circuitry 120 for access. In some embodiments, DRAM memory circuitry 120 may allow multiple memory banks and/or multiple rows to be opened for access at the same time.

The control circuitry 108 may access the opened memory bank and row for reading by transmitting a 'READ' command to the phy circuitry 116, along with along with address bits indicating the memory bank and column(s) from which data is to be read. The transmitted memory bank, row, and column (s) indicate storage element(s) from which data is to be read. In response to receiving the 'READ' command, the phy circuitry 116 may read data stored in the indicated storage elements, and present the read data to the control circuitry 108 by, e.g., transmitting the read data to the control circuitry 108 or storing the read data in a storage element accessible to the control circuitry 108. In some embodiments, the DRAM memory circuitry 120 is operated in burst of 8 mode. In particular, in response to receiving a 'READ' command, the DRAM memory circuitry 120 returns 8 data in 4 clock cycle. If DRAM memory circuitry 120 is a DDR memory, the DRAM memory circuitry 120 returns two data per clock cycle due to the implementation of the DDR interface. The control circuitry 108 may initiate a new 'READ' operation every 4 clocks, thus allowing previous burst read operation(s) to complete.

The control circuitry 116 may also access the opened memory bank and row for writing by transmitting a 'WRITE' command to the phy circuitry 116, along with data to be written and address bits indicating the memory bank and column(s) to which the data is to be written. The transmitted memory bank, row, and column(s) indicate storage element (s) to which the data is to be written. In response to receiving the 'WRITE' command, the phy circuitry 116 writes the transmitted data to the indicated storage elements. In some embodiments, the DRAM memory circuitry 120 is operated in burst of 8 mode. In particular, in response to receiving a 'WRITE' command, the DRAM memory circuitry 120 writes up to 8 data in 4 clock cycles. The control circuitry 108 may initiate a new 'WRITE' operation every 4 clocks, thus allowing previous burst write operation(s) to complete.

It will be appreciated by those skilled in the art that although the above discussion relates to the burst of 8 mode, the DRAM circuitry 120 may be operated in, e.g., a burst of 4 mode, any mode having a burst length which is a power of two, or any other appropriate burst mode without departing from the scope and spirit of the present disclosure.

After completing one or more read operations and/or one or more write operations to the opened memory bank and row, the control circuitry 108 closes the memory bank and row by transmitting a 'PRECHARGE' command to the phy circuitry 116. In response to receiving the 'PRECHARGE' command, the phy circuitry 116 performs a precharge operation on the opened memory bank and row and closes the opened memory bank and row. Before the bank and row may be accessed for further reading and/or writing, the control circuitry 108 may need to transmit another 'ACTIVATE' command to the phy circuitry 116.

In some embodiments, the phy circuitry 116 or other circuitry within the DRAM memory interface circuitry 104 may periodically refresh storage elements within the DRAM memory circuitry 120 without receiving commands from an external device such as the control circuitry 108. In some embodiments, the control circuitry 108 may refresh the storage elements within the DRAM memory circuitry 120 by transmitting a 'REFRESH' command to the phy circuitry 104. Upon receiving the 'REFRESH' command from the control circuitry 104, the phy circuitry 116 may refresh the storage elements within the DRAM memory circuitry 120.

The processing circuitry 102 operates in a first clock domain associated with a first clock rate. For example, elements of the processing circuitry 102, such as the control circuitry 108, may operate at the first clock rate. The DRAM memory interface circuitry 104 and DRAM memory circuitry 120 operate in a second clock domain associated with a second clock rate. For example, elements of the DRAM memory interface circuitry 104, such as the phy circuitry 116 and the storage elements within the DRAM memory circuitry 120, may operate at the second clock rate. In some embodiments, the first clock domain in which the processing circuitry 102 operates is independent of the second clock domain in which the DRAM memory interface circuitry 104 and DRAM memory circuitry 120 operate. In some embodiments, the second clock domain may depend on the first clock domain, e.g., the processing circuitry 102 may drive the DRAM memory interface circuitry 104 at a clock rate that is dependent upon and/or derived from the first clock domain and/or the first clock rate. In some embodiments, the first clock domain may depend on the second clock domain. In some embodiments both the first and second clock domains may be dependent upon and/or derived from a third clock domain, such as, e.g., an external system clock.

In some embodiments, if the processing circuitry 102 is an FPGA, elements of the FPGA may operate at a clock rate on the order of tens of MHz. In contrast, the DRAM system 104 may operate at a clock rate on the order of hundreds of MHz. Given the disparity between the clock rates of elements within the processing circuitry 102 and elements within the DRAM memory interface circuitry 104 and DRAM memory circuitry 120, processing circuitry 102 may not be able to interface properly with the DRAM memory interface circuitry 104. For example, while accessing storage elements within a particular memory bank and row of the DRAM memory circuitry 120, the control circuitry 108 may hold the memory bank and the row open for a certain period of time. It may not be possible to refresh the storage elements corresponding to the opened memory bank and row while the memory bank and row are opened for access, and storage elements within DRAM memory circuitry 120 may need to be refreshed at a rate above a minimum threshold rate in order to maintain their stored data. Accordingly, if the period for which the memory bank and row are opened exceeds a certain threshold length, the storage elements corresponding to the opened memory bank and row, may not be refreshed at a rate above the minimum threshold rate, and thus may not be able to maintain their stored data Given the above, the design of one or more of the processing circuitry 102, configuration of the processing circuitry 102 (e.g., if the processing circuitry 102 is an FPGA, the circuit design implemented on the FPGA), the DRAM memory interface circuitry 104, and/or the phy circuitry 116 may need to be altered in order for the processing circuitry 102 to interface properly with the DRAM memory interface circuitry 104. However, if full cycle accuracy is required for the emulated circuit design as implemented on the processing circuitry 102 (e.g., an FPGA) with respect to the circuit design as it would be implemented on an ASIC (i.e., in the final implementation and/or at a final clock rate), the processing circuitry 102 may need to operate exactly as it would in the final implementation. In particular, if full cycle accuracy is required, none of the clock cycle based timing parameters of elements of the processing circuitry 102 (e.g., the control circuitry 108) may be changed to account for the lower clock frequency of the processing circuitry 102 emulating the circuit design. In order to achieve full cycle accuracy while ensuring proper interfacing between the processing circuitry 102 and the DRAM memory interface circuitry 104, the bridge circuitry 112 may be inserted between the control circuitry 108 and the phy circuitry 116.

The bridge circuitry 112 may receive a first set of data, address(es), command(s) from the control circuitry 102 in the first clock domain (e.g., at the first clock rate) on the data link 110. In response to receiving the above input form the control circuitry 108, the bridge circuitry 112 may generate and/or translate the above input into a second set of data, address(es), and command(s), and transmit this second set to the phy circuitry 116 in the second clock domain (e.g., at the second clock rate) on the data link 114. In some embodiments, the control circuitry 108 and the phy circuitry 116 may communicate with the bridge circuitry 112 over data links 110 and 114 via the Altera Phy Interface (AFI) protocol. In some embodiments, the bridge circuitry 112 may periodically transmit 'REFRESH' commands to the phy circuitry 116, causing the phy circuitry 116 to refresh the storage elements within the DRAM memory circuitry 120, ensuring that data stored in the storage elements is not lost.

In some embodiments, the bridge circuitry 112 may allow the processing circuitry 102 and the DRAM memory interface circuitry 104/the DRAM memory circuitry 120 to operate in different clock domains (i.e., the first clock domain and the second clock domain, respectively) while ensuring proper interfacing between the processing circuitry 102 and the DRAM memory interface circuitry 104 and proper functioning of the DRAM memory circuitry 120 (i.e., ensuring that data stored in the storage elements within the DRAM memory circuitry 120 is not lost).

In some embodiments, the DRAM memory interface circuitry 104 operating in the second clock domain and coupled to the processing circuitry through the bridge circuitry 112 may appear to the processing circuitry 102 as a DRAM memory circuitry operating in the first clock domain. Accordingly, a circuit design being emulated on the processing circuitry 102 can properly interface with the DRAM memory interface circuitry 104, ensuring that the emulation of the circuit design has full cycle accuracy with respect to the circuit design as it would be implemented on an ASIC.

Figure 2:
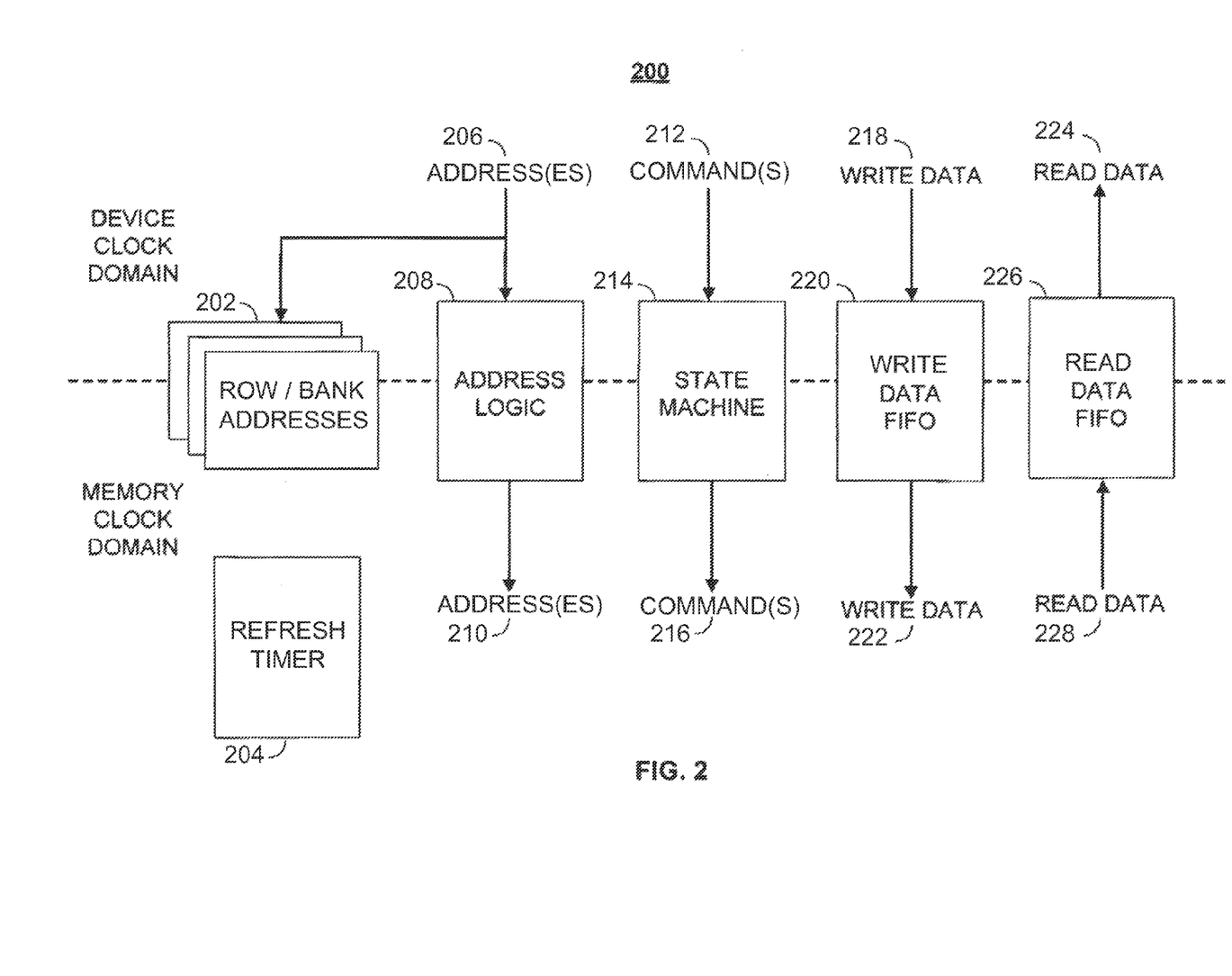
FIG. 2 shows a further exemplary memory interface system according to an embodiment of the present disclosure.

FIG. 2 shows an exemplary memory interface system 200 according to an embodiment of the present disclosure. In some embodiments, system 200 may be an embodiment of the bridge circuitry 112 of FIG. 1. Although system 200 will be referred to as bridge circuitry 112 in the following description, it will appreciated by those skilled in the art that system 200 may be implemented either independently from or as part of circuitries other than circuitry 112 FIG. 1 without departing from the spirit and scope of the present disclosure. It will likewise be appreciated by those skilled in the art that the bridge system 112 of FIG. 1 may be implemented using circuitries other than the exemplary memory interface system 200 without departing from the spirit and scope of the present disclosure.

Memory interface system 200 (e.g., the bridge circuitry 112) includes one or more storage elements 202, address logic 208, state machine 214, write data storage element 220 (e.g., a First In, First Out (FIFO) storage element), and read data storage element 226 (e.g., a FIFO storage element).

The control circuitry 108 may access a storage element within the DRAM memory interface circuitry 104 by transmitting, in the first clock domain (i.e., in the device clock domain, and e.g., at the first clock rate) an 'ACTIVATE' command 212 to the bridge circuitry 112, along with address bits 206 indicating the memory bank and row of the storage element within the memory 104 to be accessed. In response to receiving from the control circuitry 108 the 'ACTIVATE' command 212, the bridge circuitry 112 may store the address bits in the storage element 202, process the address bits 206 with the address logic 208, and process the received 'ACTIVATE' command 212 with the state machine 214.

The control circuitry 108 may then access the memory bank and row for reading by transmitting in the first clock domain (e.g., at the first clock rate) a 'READ' command 212 to the bridge circuitry 112, along with address bits 206 indicating the memory bank and column(s) from which data is to be read. In response to receiving from the control circuitry 108 the 'READ' command 212, the bridge circuitry 112 may process the address bits 206 with the address logic 208, and process the received 'READ' command 212 with the state machine 214.

In order to perform the read operation, the bridge circuitry 112 may first check whether a row/bank within the memory circuitry 120 indicated by the address bits 206 has already been opened. The storage element 202 may include a storage location associated with each memory bank within the memory circuitry 120. The bridge circuitry 112 may compare the received address bits 206 (which may indicate a row and bank within the memory circuitry 120 to be opened) with address bits stored within the storage element 202 in a storage location corresponding to that bank. If the address bits match, then the corresponding bank has already been opened, and an 'ACTIVATE' command does not need to be issued. Otherwise, the bridge circuitry 112 may use the received address bits 206 to generate and transmit to the phy circuitry 116, in the second clock domain (i.e., in the memory clock domain, and e.g., at the second clock rate), an 'ACTIVATE' command 216 (via the state machine 214) and address bits 210 indicating the memory bank and row to be opened.

In response to receiving the 'ACTIVATE' command 216 from the bridge circuitry 112, the phy circuitry 116 may open the indicated memory bank and row within the DRAM memory circuitry 120 for access.

The bridge circuitry 112 may then generate and transmit to the phy circuitry 116 in the second clock domain (e.g., at the second clock rate) a 'READ' command 216 (via the state machine 214) and address bits 210 indicating memory bank and column(s) from which data is to be read.

In response to receiving the 'READ' command 216, the phy circuitry 116 may read data stored in the storage elements indicated by the memory bank and/or row address bits stored in the storage element 202 and by the memory bank and/or column address bits 210, and store the read data 228 in the read data storage element 226. The bridge circuitry 112 may present the read data 228 to the control circuitry 108 by, e.g., transmitting the read data 228 to the control circuitry 108 as read data 224, or storing the read data 228 in the read data storage element 226 accessible to the control circuitry 108.

The control circuitry 108 may also access the memory bank and row for writing by transmitting in the first clock domain (e.g., at the first clock rate) a 'WRITE' command 212 to the bridge circuitry 112, along with data 218 to be written and address bits 206 indicating the memory bank and column (s) to which the data 218 is to be written. In response to receiving from the control circuitry 108 the 'WRITE' command 212, the bridge circuitry 112 may store the data 218 in the write data storage element 220, process the address bits 206 with the address logic 208, and process the received 'WRITE' command 212 with the state machine 214.

In order to perform the write operation, the bridge circuitry 112 may first check whether a row/bank within the memory circuitry 120 indicated by the address bits 206 has already been opened. The bridge circuitry 112 may compare the received address bits 206 (which indicate a row and bank within the memory circuitry 120 to be opened) with address bits stored within the storage element 202 in a storage location corresponding to that bank. If the address bits match, then the bank has already been opened, and an 'ACTIVATE' command does not need to be issued. Otherwise, the bridge circuitry 112 may use the received address bits 206 to generate and transmit to the phy circuitry 116 in the second clock domain (i.e., in the memory clock domain, and e.g., at the second clock rate) an 'ACTIVATE' command 216 (via the state machine 214) and address bits 210 indicating the memory bank and row to be opened.

In response to receiving the 'ACTIVATE' command 216 from the bridge circuitry 112, the phy circuitry 116 may open the indicated memory bank and row within the DRAM memory circuitry 120 for access. [0059] The bridge circuitry 112 may then generate and transmit to the phy circuitry 116 in the second clock domain (e.g., at the second clock rate) a 'WRITE' command 216 (via the state machine 214), the data 222 to be written, and address bits 210 indicating memory bank and column(s) to which the data 222 is to be written.

In response to receiving the 'WRITE' command 216 from the state machine 214, the phy circuitry 116 may write the data 222 to the storage elements indicated by the memory bank and/or row address bits stored in the storage element 202 and by the memory bank and/or column address bits 210.

After completing a read operation from and/or a write operation to the opened memory bank and row, the state machine 214 closes the memory bank and row by generating and transmitting a 'PRECHARGE' command 216 to the phy circuitry 116. In response to receiving the 'PRECHARGE' command 216, the phy circuitry 116 performs a precharge operation on the opened memory bank and row and closes the opened memory bank and row. In some embodiments, the state machine 214 transmits a 'PRECHARGE' command 216 to the phy circuitry 116 after each read operation and/or write operation, independent of whether or not a 'PRECHARGE' command 212 is received from the control circuitry 108. In some embodiments, no operation is performed (NOP) by the state machine 214 when a 'PRECHARGE' command 212 is received from the control circuitry 108.

In some embodiments, the control circuitry 108 may perform data reading in burst mode. In burst mode, the control circuitry transmits a burst 'READ' command and a starting memory address, and the DDR memory interface circuitry 104 returns in 4 clock cycles data stored at the starting memory address and seven immediately following consecutive memory addresses.

In some embodiments, the control circuitry 108 may also perform data writing in burst mode. In burst mode, the control circuitry transmits a burst 'WRITE' command, a starting address, and data to be written, and the DDR memory interface circuitry 104 writes the data in 4 clock cycles to the starting memory address and seven immediately following consecutive memory addresses.

When a burst 'READ'/'WRITE' command 212 received by the bridge circuitry 112/state machine 214 from the control circuitry 108 indicates that data from multiple consecutive storage elements is to be accessed for reading or writing, the bridge circuitry 112 may store the received starting address bits 206 within the storage element 202 and/or the address logic 208. For received burst 'WRITE' commands, the bridge circuitry 112 stores the to-be-written data in the write data storage element 220. The state machine 214 then generates and transmits to the phy circuitry 116 multiple sequences of 'ACTIVATE', 'READ' or 'WRITE', and 'PRECHARGE' commands 216, accessing the received starting memory address and seven immediately following consecutive memory addresses for reading or writing. The 'ACTIVATE' command in each sequence instructs the phy circuitry 116 to open, within the DRAM memory interface circuitry 104, a memory bank and row corresponding to the address bits of each consecutive memory address.

If the command received from the control circuitry 108 is a burst 'WRITE' command, the 'WRITE' command in each sequence transmitted by the state machine 214 instructs the phy circuitry 116 to write data stored in the write data storage element 220 to a memory address within the DRAM memory circuitry 120 (transmitted concurrently with the 'WRITE' command by the storage element 202 and/or the address logic 208) associated with the 'WRITE' command and the to-be-written data. Following the 'WRITE' command, the state machine 214 transmits a 'PRECHARE' command to the phy circuitry 116, causing the phy circuitry 116 to close the opened memory bank and row. The state machine 214 generates and transmits sequence of 'ACTIVATE', 'WRITE', and 'PRECHARGE' commands 216 until data associated with each of the eight consecutive memory addresses has been written, then proceeds to an idle state.

If the command received from the control circuitry 108 is a burst 'READ' command, the 'READ' command in each sequence transmitted by the state machine 214 instructs the phy circuitry 116 to read data stored at a memory address within the DRAM memory circuitry 120 associated with and transmitted concurrently with the 'READ' command by the storage element 202 and/or the address logic 208. The phy circuitry 116 stores the read data corresponding to the 'READ' command in the read data storage element 226. Following the 'READ' command, the state machine 214 transmits a 'PRECHARE' command to the phy circuitry 116, causing the phy circuitry 116 to close the opened memory bank and row. The state machine 214 generates and transmits sequence of 'ACTIVATE', 'READ', and 'PRECHARGE' commands 216 until data associated with each of the eight consecutive memory addresses has been read, then proceeds to an idle state. In some embodiments, read data 228 resulting from each sequence of 'ACTIVATE', 'READ', and 'PRECHARGE' commands 216 is provided to the control circuitry 108 at the exact clock cycle that the read data would be returned in response to a burst read request from the control circuitry 108 to a properly-functioning DRAM memory circuitry operating in the first clock domain (i.e., the clock domain in which the control circuitry 108 operates).

Accordingly, by using the bridge circuitry 112, a circuit design being emulated on the processing circuitry 102 can properly interface with the DRAM memory interface circuitry 104 during read and write operations, ensuring that the emulation of the of the circuit design has full cycle accuracy with respect to a circuit design as it would be implemented on an ASIC.

In some embodiments, the state machine 214 within the bridge circuitry 112 periodically generates and transmits 'REFRESH' commands 216 to the phy circuitry 116 based an indication from the refresh timer 204 that a refresh cycle is required. In response to receiving a 'REFRESH' command 216 from the bridge circuitry 112, the phy circuitry 116 refreshes the storage elements within the DRAM memory circuitry 120. In some embodiments, the state machine circuitry 214 and/or other circuitry within the bridge circuitry 112 generates and transmits the 'REFRESH' commands 216 to the phy circuitry 116 independent of whether or not a 'REFRESH' command is received from the control circuitry 108. In some embodiments, no operation is performed (NOP) by the bridge circuitry 112 when a 'PRECHARGE' command is received from the control circuitry 108.

In some embodiments, no operation is performed by the by the state machine 214 upon receiving, from the control circuitry 108, other commands such as, e.g., the 'WRITE MODE REG' command.

In some embodiments, the bridge circuitry 112, by itself and/or as implemented by memory interface system 200 of FIG. 2, may synchronize signals received from/transmitted to control circuitry 108 in the first clock domain on data link 110 and signals received from/transmitted to the phy circuitry 116 in the second clock domain on data link 114. Advantageously, such synchronization ensures that a metastable state does not occur between the control circuitry 108 and the phy circuitry 116.

In some embodiments, the bridge circuitry 112 as implemented by memory interface system 200 of FIG. 2 may allow the processing circuitry 102 and the DRAM memory interface circuitry 104 to operate in different clock domains (i.e., the first clock domain and the second clock domain, respectively), while ensuring proper interfacing between the processing circuitry 102 and the DRAM memory interface circuitry 104 and proper functioning of the DRAM memory circuitry 120 (i.e., ensuring that data stored in the storage elements within the DRAM memory circuitry 120 is not lost).

In some embodiments, the DRAM memory interface circuitry 104 operating in the first clock domain and coupled to the processing circuitry 102 through the bridge circuitry 112 as implemented above may appear to the processing circuitry 102 as a DRAM memory circuitry operating in the first clock domain. Accordingly, a circuit design being emulated on the processing circuitry 102 can properly interface with the DRAM memory interface circuitry 104, ensuring that the emulation of the of the circuit design has full cycle accuracy with respect to the circuit design as it would be implemented on an ASIC.

In some embodiments, instead of being inserted between the control circuitry 108 and the phy circuitry 116, the bridge circuitry 112 may be inserted between the phy circuitry 116 and the storage elements within the DRAM memory circuitry 120. In these embodiments, the control circuitry 108 and the phy circuitry 116 operate in the first clock domain (e.g., the control circuitry 108 may drive the phy circuitry 116 at the first clock rate). The modified bridge circuitry 112 may receive a first set of data, address bits, and commands from the phy circuitry 116 in the first clock domain (e.g., at the first clock rate) and, based on the received first set of data, address bits, and/or commands, generates and transmits a second set of data, address bits, and/or commands to the storage elements or other circuitry within the DRAM memory circuitry 120 in the second clock domain (i.e., at the second clock rate). The modified bridge circuitry 112 may function in a manner substantially similar to that of unmodified circuitry 112 as described above in connection with FIGS. 1 and 2 of the present disclosure. In particular, the modified bridge circuitry 112 may generate and transmit 'REFRESH' commands to the storage elements independent of whether or not 'REFRESH' commands are received from the phy circuitry 116, thus ensuring that the data stored in the storage elements is not lost.

It will be appreciated by those skilled in the art that although a particular configuration of memory interface system 200 is shown, other configurations may be implemented without departing from the scope and spirit of the disclosure. For example, elements of memory interface 200 system may be removed, the interconnections between elements of the memory interface system 200 may be changed, and new elements may be added. It will be appreciated by those skilled in the art that memory interface system 200 shown in FIG. 2 is merely illustrative, and that any other the memory interface system implementing the functionality of translating read/write commands received in a first clock domain into read/write commands in a second clock domain may be implemented without departing from the spirit and scope of the present disclosure.

Figure 3:
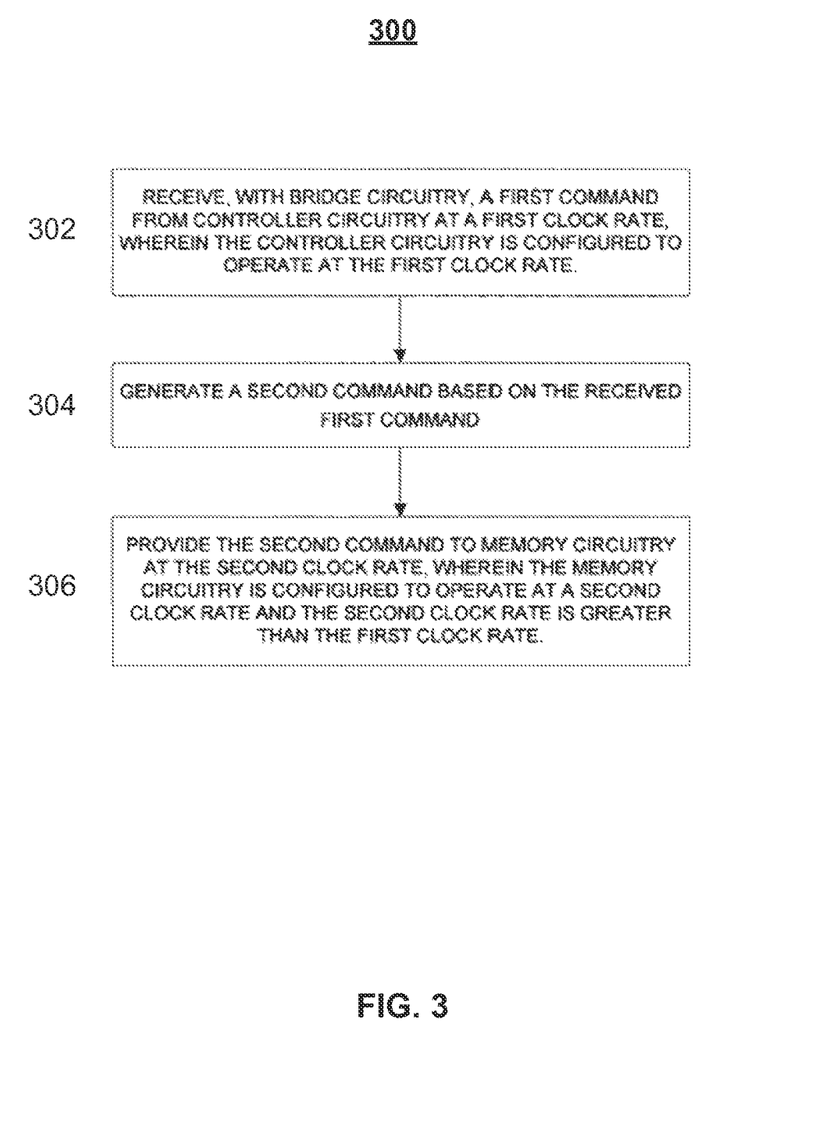
FIG. 3 shows an illustrative flow diagram of an exemplary process for operating a memory interface system according to an embodiment of the present disclosure.

FIG. 3 shows an illustrative flow diagram of an exemplary process 300 for operating a memory interface system according to an embodiment of the present disclosure.

At 302 a first command from control circuitry is received by the bridge circuitry at a first clock rate. The control circuitry from which the command is received is configured to operate at the first clock rate.

At 304, a second command is generated based on the received first command.

At 306, the second command is provided to memory circuitry at a second clock rate. The memory circuitry is configured to operate at the second clock rate, and the second clock rate is greater than the first clock rate.

The foregoing is merely illustrative of the principles of this disclosure and various modifications can be made by those skilled in the art without departing from the scope and spirit of the disclosure. The above described embodiments of the present disclosure are presented for purposes of illustration and not of limitation, and the present disclosure is limited only by the claims which follow.

What is claimed is:

1. A system comprising bridge circuitry, wherein the bridge circuitry is configured to:
   receive a first command from control circuitry at a first clock rate, wherein:
      the control circuitry comprises programmable circuitry, and
      the control circuitry is configured to operate at the first clock rate;
   generate a second command based on the received first command; and
   transmit the second command to memory circuitry at a second clock rate, wherein:
      the memory circuitry comprises dynamic random access memory (DRAM) circuitry,
      the memory circuitry is configured to operate at the second clock rate, and
      the second clock rate is greater than the first clock rate.

2. The system of claim 1, wherein:
   data stored in the DRAM memory circuitry is lost in response to the DRAM memory circuitry receiving the refresh commands at a rate less than a threshold rate, and
   the control circuitry, in response to being configured to operate at the first clock rate, is configured to transmit the refresh commands to the DRAM memory circuitry at a maximum rate that is less than the threshold rate.

3. The system of claim 1, wherein:
   the bridge circuitry further comprises refresh timer circuitry configured to periodically refresh data stored in the DRAM memory circuitry.

4. The system of claim 1, wherein the bridge circuitry is further configured to:
   receive a data read command from the control circuitry, wherein the data read command is associated with a first interface scheme;
   transmit to the memory circuitry a plurality of commands based on the received data read command, wherein the transmitted plurality of commands is associated with the first interface scheme, and
   receive, from the memory circuitry, based on the transmitted plurality of commands, stored data associated with the data read command.

5. The system of claim 1, wherein the bridge circuitry is further configured to:
   receive, from the control circuitry, a data write command and data associated with the data write command, wherein the data write command is associated with a first interface scheme; and
   transmit to the memory circuitry a plurality of commands based on the received data write command, wherein:
      the plurality of commands are associated with the first interface scheme, and
      the plurality of commands configure the memory circuitry to store the data associated with the received data write command.

6. The system of claim 1, wherein the bridge circuitry is further configured to:
   receive, with the bridge circuitry, a burst data read command from the control circuitry, wherein the burst data read command is associated with a plurality of data addresses of data stored in the memory circuitry;
   transmit to the memory circuitry a plurality of commands based on the received burst data read command, and
   receive, from memory circuitry, based on the transmitted plurality of commands, data stored in the memory circuitry at each data address of the plurality of data addresses.

7. The system of claim 1, wherein:
   the control circuitry is configured to operate in a first clock domain associated with the first clock rate;
   the memory circuitry is configured to operate in a second clock domain associated with the second clock rate; and the first clock domain is independent from the second clock domain.

8. The system of claim 1, wherein the bridge circuitry is further configured to appear to the control circuitry as a further memory circuitry configured to operate at the first clock rate.

9. A method comprising:
receiving, with bridge circuitry, a first command from control circuitry at a first clock rate, wherein:
the control circuitry comprises programmable circuitry, and
the control circuitry is configured to operate at the first clock rate;
generating a second command based on the received first command; and
transmitting the second command to memory circuitry at a second clock rate, wherein:
the memory circuitry comprises dynamic random access memory (DRAM) circuitry,
the memory circuitry is configured to operate at the second clock rate, and
the second clock rate is greater than the first clock rate.

10. The method of claim 9, wherein:
data stored in the DRAM memory circuitry is lost in response to the DRAM memory circuitry receiving the refresh commands at a rate less than a threshold rate, and
the control circuitry, in response to being configured to operate at the first clock rate, is configured to transmit the refresh commands to the DRAM memory circuitry at a maximum rate that is less than the threshold rate.

11. The method of claim 9, wherein:
the bridge circuitry further comprises refresh timer circuitry configured to periodically refresh data stored in the DRAM memory circuitry.

12. The method of claim 9, further comprising:
receiving, with the bridge circuitry, a data read command from the control circuitry, wherein the data read command is associated with a first interface scheme;
transmitting to the memory circuitry a plurality of commands based on the received data read command, wherein the transmitted plurality of commands is associated with the first interface scheme, and
receiving, from the memory circuitry, based on the transmitted plurality of commands, stored data associated with the data read command.

13. The method of claim 9, further comprising:
receiving, with the bridge circuitry, from the control circuitry, a data write command and data associated with the data write command, wherein the write command is associated with a first interface scheme; and
transmitting to the memory circuitry a plurality of commands based on the received data write command, wherein:
the plurality of commands are associated with the first interface scheme, and
the plurality of commands configure the memory circuitry to store the data associated with the received data write command.

14. The method of claim 9, further comprising:
receiving, with the bridge circuitry a burst data read command from the control circuitry, wherein the burst data read command is associated with a plurality of data addresses of data stored in the memory circuitry;
transmitting to the memory circuitry a plurality of commands based on the received burst data read command, and
receiving, from memory circuitry, based on the transmitted plurality of commands, data stored in the memory circuitry at each data address of the plurality of data addresses.

15. The method of claim 9, wherein:
the control circuitry is configured to operate in a first clock domain associated with the first clock rate;
the memory circuitry is configured to operate in a second clock domain associated with the second clock rate; and
the first clock domain is independent from the second clock domain.

16. The method of claim 9, wherein the bridge circuitry is further configured to appear to the control circuitry as a further memory circuitry configured to operate at the first clock rate.

17. Bridge circuitry comprising:
address logic circuitry configured to process a first data address received from control circuitry at a first clock rate, wherein the control circuitry is configured to operate at the first clock rate;
state machine circuitry configured to generate a first plurality of commands based on a read command received from the control circuitry at the first clock rate; and
read data circuitry configured to:
receive, from memory circuitry, first data stored in the memory circuitry based on transmitting the processed first data address and the generated first plurality of commands to the memory circuitry at a second clock rate, wherein:
the memory circuitry is configured to operate a at the second clock rate, and
the second clock rate is greater than the first clock rate; and
store the received first data in read buffer circuitry accessible to the control circuitry.

18. The bridge circuitry of claim 17, further comprising write data circuitry configured to receive, at the first clock rate, second data from the control circuitry, wherein:
the address logic circuitry is further configured to process a second data address received from the control circuitry,
the second data is associated with a second data address,
the state machine circuitry is further configured to generate a second plurality of commands based on a write command received from the control circuitry at the first clock rate, and
the memory circuitry is further configured to store the second data at the processed second data address based on receiving the second plurality of commands from the bridge circuitry at the second clock rate.

* * * * *